United States Patent
She et al.

(10) Patent No.: US 10,837,109 B2
(45) Date of Patent: Nov. 17, 2020

(54) CVI/CVD MATRIX DENSIFICATION PROCESS AND APPARATUS

(71) Applicant: United Technologies Corporation, Farmington, CT (US)

(72) Inventors: Ying She, East Hartford, CT (US); Cristal Chan, East Hampton, CT (US)

(73) Assignee: United Technologies Corporation, Farmington, CT (US)

( * ) Notice: Subject to any disclaimer, the term of this patent is extended or adjusted under 35 U.S.C. 154(b) by 0 days.

(21) Appl. No.: 16/192,286

(22) Filed: Nov. 15, 2018

(65) Prior Publication Data
US 2020/0157679 A1    May 21, 2020

(51) Int. Cl.
*C23C 16/455*    (2006.01)
*C23C 16/52*    (2006.01)

(52) U.S. Cl.
CPC ........ *C23C 16/45512* (2013.01); *C23C 16/52* (2013.01)

(58) Field of Classification Search
CPC .......................... C23C 16/45512; C23C 16/52
See application file for complete search history.

(56) References Cited

U.S. PATENT DOCUMENTS

| | | | | |
|---|---|---|---|---|
| 4,823,734 A * | 4/1989 | Christin | .............. | C04B 41/4505 118/715 |
| 4,844,719 A * | 7/1989 | Toyomoto | ............ | B01D 53/268 95/52 |
| 4,863,798 A * | 9/1989 | Arenz | ...................... | C04B 30/02 428/368 |
| 5,900,297 A * | 5/1999 | Rudolph | .................. | C04B 35/83 428/66.2 |
| 6,143,078 A * | 11/2000 | Ishikawa | ........... | H01L 21/67017 118/715 |
| 6,197,374 B1* | 3/2001 | Huttinger | ............ | C04B 41/4531 427/249.15 |
| 6,744,023 B2* | 6/2004 | Garn | ........................ | F27B 5/06 118/724 |

(Continued)

FOREIGN PATENT DOCUMENTS

| | | |
|---|---|---|
| EP | 3211120 A1 | 8/2017 |
| FR | 1524507 A | 5/1968 |

OTHER PUBLICATIONS

Hu, Chenglong, et al., "Sandwich-structured C/C-SiC composites fabricated by electromagnetic-coupling chemical vapor infiltration". Scientific Reports, 7: 13120, pp. 1-9. DOI:10.1038/s41598-017-13569-9.*

(Continued)

*Primary Examiner* — Bret P Chen
(74) *Attorney, Agent, or Firm* — Kinney & Lange, P.A.

(57) ABSTRACT

A chemical vapor infiltration and deposition (CVI/CVD) reactor assembly includes a CVI/CVD reactor and a reactant gas feed source. The CVI/CVD reactor includes a first inlet at a first end of the CVI/CVD reactor, a second inlet at a second end of the CVI/CVD reactor opposite the first end, a first outlet at the second end, a second outlet at the first end, and a chamber in fluid communication with the first and second inlets and first and second outlets and configured to hold a substrate. The reactant gas feed source is interchangeably and fluidly connected to the first and second inlets by first and second valved gas lines, respectively.

18 Claims, 3 Drawing Sheets

(56) References Cited

U.S. PATENT DOCUMENTS

| | | | |
|---|---|---|---|
| 6,758,909 B2 | 7/2004 | Jonnalagadda et al. | |
| 6,780,462 B2 | 8/2004 | Purdy et al. | |
| 6,942,893 B2* | 9/2005 | Delperier | C04B 35/83 |
| | | | 118/719 |
| 7,959,973 B2* | 6/2011 | Waghray | C04B 35/83 |
| | | | 427/249.1 |
| 8,491,963 B2 | 7/2013 | Lamouroux et al. | |
| 9,963,779 B2 | 5/2018 | Rudolph et al. | |
| 10,683,572 B2* | 6/2020 | Richards | B01D 53/72 |
| 2003/0035893 A1* | 2/2003 | Daws | C23C 16/045 |
| | | | 427/255.28 |
| 2004/0071877 A1* | 4/2004 | Goujard | C23C 16/45508 |
| | | | 427/255.28 |
| 2006/0196419 A1 | 9/2006 | Tudhope et al. | |
| 2007/0154382 A1* | 7/2007 | Edwin | B01J 4/002 |
| | | | 423/447.3 |
| 2008/0152803 A1* | 6/2008 | Lamouroux | C23C 16/45578 |
| | | | 427/248.1 |
| 2008/0317956 A1* | 12/2008 | Reber | C23C 16/4401 |
| | | | 427/255.28 |
| 2009/0061643 A1 | 3/2009 | Takeyama et al. | |
| 2013/0284587 A1* | 10/2013 | Bakhtari | C01B 13/10 |
| | | | 204/157.44 |
| 2014/0271161 A1* | 9/2014 | Lazur | F01D 5/282 |
| | | | 415/200 |
| 2016/0229458 A1* | 8/2016 | Mildner | B62D 25/06 |
| 2017/0247793 A1* | 8/2017 | Rudolph | C23C 16/45523 |
| 2017/0348876 A1* | 12/2017 | Lin | B29C 35/02 |
| 2018/0057931 A1 | 3/2018 | Cha et al. | |
| 2019/0092699 A1* | 3/2019 | Luthra | C04B 35/6316 |

OTHER PUBLICATIONS

Deck, Christian P., et al., "Modeling Forced Flow Chemical Vapor Infiltration Fabrication of SiC—SiC Composites for Advanced Nuclear Reactors". Science and Technology of Nuclear Installations, vol. 2013, Article ID 127676, pp. 1-10. http://dx.doi.org/10.1155/2013/127676.*

Zhu, Yaochan, et al., "Numerical Modeling Chemical Vapor Infiltration of SiC Composites". Journal of Chemistry, vol. 2013, Article ID 836187, pp. 1-11. http://dx.doi.org/10.1155/2013/836187.*

Besmann, T. et al., "A Method for Rapid Chemical Vapor Infiltration of Ceramic Composites". Journal de Physique Colloques, 1989, 50 (C5), pp. C5-229-C5-239. 10.1051/jphyscol:1989529ff. ffjpa-00229552f.*

Zhu, Yaochan, et al., "Numerical Modeling Chemical Vapor Infiltration of SiC Composites". Journal of Chemistry, Hindawi Publishing Corporation, vol. 2013, Article ID 836187, pp. 1-11. https://doi.org/10.1155/2013/836187.*

Leuchs, Martin, "Ceramic Matrix Composites: CVI (Chemical Vapor Infiltration)". Wiley Encyclopedia of Composites, Second Edition. Edited by Luigi Nicolais and Assunta Borzacchiello. © 2012 John Wiley & Sons, Inc. pp. 1-12.*

Extended European Search Report for EP Application No. 19208990.2, dated Apr. 9, 2020, 9 pages.

* cited by examiner

CVI/CVD MATRIX DENSIFICATION PROCESS AND APPARATUS

BACKGROUND

The present disclosure is generally related to chemical vapor infiltration and deposition (CVI/CVD) and more specifically related to a CVI/CVD reactor and process capable of promoting uniform deposition and densification.

CVI/CVD is a known process for making composite structures including ceramic matrix composites. In conventional CVI/CVD processes, a reactant gas or gas mixture passes around a stack of heated porous structures (e.g., fibrous preforms) in an isobaric reactor chamber. Current CVI/CVD reactors provide the reactant gas through an inlet at one end of the reactor chamber and remove gas through an outlet at an opposite end of the reactor chamber. The reactant gas diffuses into one or more porous structures positioned in the reactor chamber and undergoes a reaction to form a matrix material. The precursor gases are consumed by porous structures or portions of a porous structure positioned nearest the gas inlet, making less reactant gas available for porous structures or portions of a porous structure nearest the outlet of the reactor. This can lead to non-uniform matrix densification within a single porous structure or between multiple porous structures based on their location within the reactor chamber. To promote uniform infiltration and matrix densification, the CVI/CVD reactor is shut down and the porous structures are rearranged within the reactor chamber. Such rearrangement may be required multiple times during the CVI/CVD process to improve density uniformity.

A CVI/CVD reactor and process is needed that can promote uniformity in matrix densification while reducing or eliminating inefficiencies in manufacturing resulting from the need to rearrange porous structures to account for non-uniform gas distribution in the reactor.

SUMMARY

A chemical vapor infiltration and deposition (CVI/CVD) reactor assembly includes a CVI/CVD reactor and a reactant gas feed source. The CVI/CVD reactor includes a first inlet at a first end of the CVI/CVD reactor, a second inlet at a second end of the CVI/CVD reactor opposite the first end, a first outlet at the second end, a second outlet at the first end, and a chamber in fluid communication with the first and second inlets and first and second outlets and configured to hold a substrate. The reactant gas feed source is interchangeably and fluidly connected to the first and second inlets by first and second valved gas lines, respectively.

A chemical vapor infiltration and deposition (CVI/CVD) process includes supplying a reactant gas to a CVI/CVD reactor chamber through a first inlet located at a first end of the reactor chamber, removing a first exhaust gas from the reactor chamber through a first outlet located at a second end of the reactor chamber opposite the first end, supplying the reactant gas to the reactor chamber through a second inlet located at the second end of the reactor chamber, and removing a second exhaust gas from the reactor chamber through a second outlet at the first end of the reactor chamber. Supplying the reactant gas through the first inlet and the second inlet is conducted in an alternating fashion.

The present summary is provided only by way of example, and not limitation. Other aspects of the present disclosure will be appreciated in view of the entirety of the present disclosure, including the entire text, claims, and accompanying figures.

While the above-identified figures set forth one or more embodiments of the present disclosure, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features and components not specifically shown in the drawings.

DETAILED DESCRIPTION

Chemical vapor infiltration and deposition (CVI/CVD) can be used to produce ceramic matrix composite (CMC) components suited for high temperature applications including use in gas turbine engines. In conventional isobaric CVI/CVD reactors, reactant gas is provided to a reactor chamber through an inlet at one end of the reactor chamber and is exhausted through an outlet at an opposite end of the reactor chamber. The reactant gas diffuses into one or more porous structures positioned in the reactor chamber and undergoes a reaction to form a ceramic matrix. The precursor gases are consumed by porous structures or portions of a porous structure positioned nearest the inlet, making less reactant gas available for porous structures or portions of a porous structure nearest the outlet of the reactor. This can lead to non-uniform matrix densification within a single porous structure or between multiple porous structures based on their location within the reactor chamber. In the CVI/CVD process and apparatus of the present disclosure, reactant gas is alternatively fed to inlets at opposite ends of the reactor to reverse gas flow within the reactor, such that porous structures located farthest from the gas inlet in one mode of operation are located closest to the gas inlet in another mode of operation. Alternating gas feed in this manner promotes uniform infiltration and matrix densification by increasing the availability of reactant gas throughout the reactor.

Figure 1:
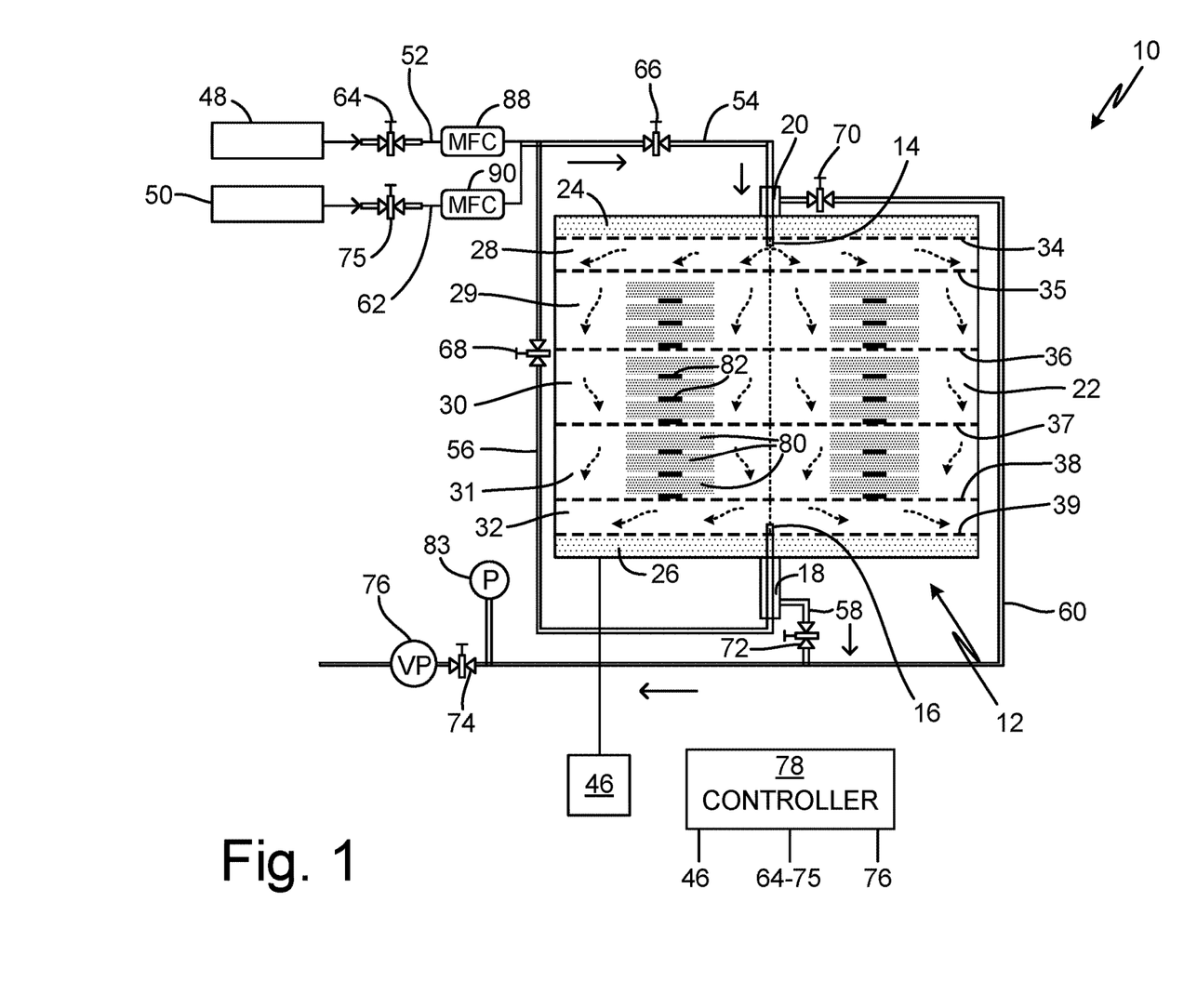
FIG. 1 is a schematic view of a chemical vapor deposition/chemical vapor infiltration (CVI/CVD) reactor illustrating the direction of gas flow through the reactor in a first mode of operation.
Figure 2:
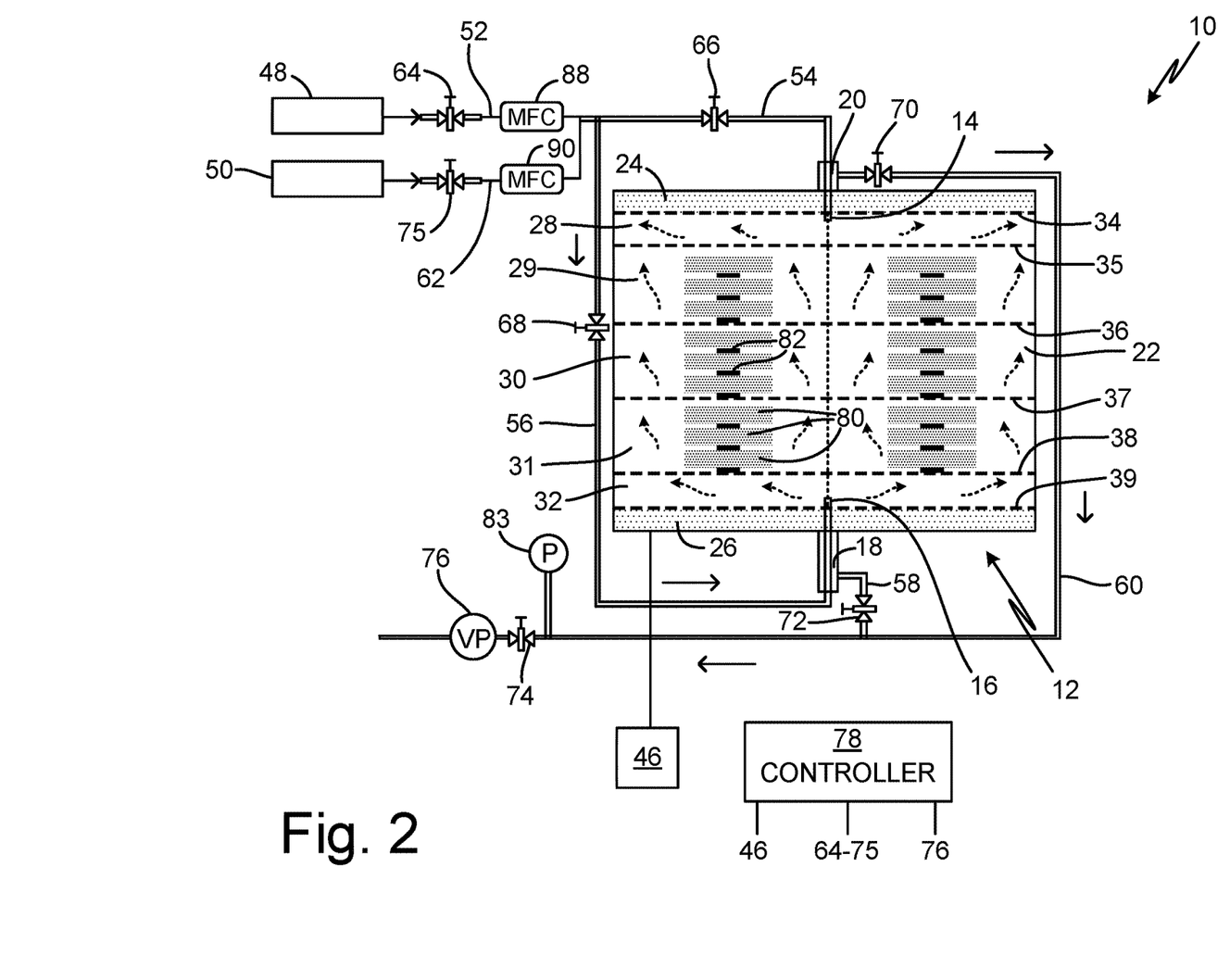
FIG. 2 is a schematic view of the CVI/CVD reactor of FIG. 1 illustrating the direction of gas flow through the reactor in a second mode of operation.

FIG. 1 is a schematic view of CVI/CVD assembly 10, illustrating the direction of gas flow through the reactor in a first mode of operation. FIG. 2 is a schematic view of CVI/CVD assembly 10, illustrating the direction of gas flow through the reactor in a second mode of operation. CVI/CVD assembly 10 includes reactor 12, having gas inlets 14, 16, gas outlets 18, 20, reaction chamber 22, and completion beds 24, 26. Chamber 22 can be subdivided into a plurality of levels or sub-chambers 28-32, defined between gas distributor plates 34-39. CVI/CVD assembly 10 further includes heat source 46, reactant gas source 48, purge gas source 50, a plurality of gas lines 52, 54, 56, 58, 60, 62 fluidly connected to reactor 12 and operable via valves 64, 66, 68, 70, 72, 74, 75, and vacuum pump 76 fluidly connected to reactor 12. In some embodiments, CVI/CVD assembly 10 can include controller 78, which can be communicatively coupled to heat source 46, valves 64-75, vacuum pump 76, and other components of CVI/CVD assembly 10 to facilitate operation of CVI/CVD assembly 10.

CVI/CVD reactor 12 can be an isobaric reactor configured to house one or more substrates 80 and to facilitate chemical vapor infiltration of a reactant gas into substrates 80 and/or deposition of a reactant gas onto substrates 80. Substrate 80 can be a porous structure, such as a fibrous preform made of carbon (C) or silicon carbide (SiC) fibers. CVI can be used for the manufacture of CMC components in which a fibrous preform is densified with a refractory matrix. Examples of CMCs include C/C composites, C/SiC composites, SiC/SiC composites, alumina ($Al_2O_3$)/$Al_2O_3$ composites, and the like, where the first compound makes up the fibrous preform and the second compound forms the matrix. In some embodiments, CVI can be used to apply interphase coatings (e.g., boron nitride) to fibers prior to matrix densification. In some embodiments, CVD may be used to deposit a coating on a non-porous structure or preform. While the present disclosure is generally directed to the manufacture of CMC components, it will be understood by one of ordinary skill in the art that CVI/CVD assembly 10 and the disclosed method can replace conventional isobaric CVI/CVD assemblies and methods of manufacture where uniform infiltration and deposition is an issue, and that the disclosed CVI/CVD assembly 10 and method is not limited to the manufacture of CMCs.

As illustrated in FIGS. 1 and 2, substrates 80 can be stacked inside CVI/CVD reaction chamber 22, separated by spacers 82. Spacers 82 can be porous structures capable of separating adjacent substrates 80 within a stack, while allowing gas to flow between adjacent substrates 80, into substrates 80, and onto external surfaces of substrates 80. Chamber 22 can be divided into multiple levels or sub-chambers 28-32, defined between distributor plates 34-39. As illustrated in FIGS. 1 and 2, a plurality of substrates 80 can be divided among three levels 29, 30, and 31, defined between distributor plates 35, 36, and 37. Distributor plates 35, 36, and 37 can be used to provide support (e.g., shelves) for multiple substrates 80 within chamber 22 and to facilitate reactant gas redistribution among levels 29, 30, and 31. Gas distributor plates 34-39 can be perforated or otherwise porous members that allow for diffusion or flow of reactant gas between chambers 28-32. Gas distributor plates 34-39 can be oriented parallel to top and bottom walls of reactor 12 to divide reactor 12 into levels or sub-chambers oriented in a stacked arrangement from the top to the bottom of reactor 12 or between gas inlet 14 and gas outlet 18. While FIGS. 1 and 2 illustrate substrates 80 being divided among three levels or sub-chambers 29, 30, and 31, it will be understood by one of ordinary skill in the art that the number of levels as well as the height of each level can be increased or decreased depending on the application. Distributor plates 35-38 can rest on adjustable supports on an inner wall of chamber 22 or be secured in a manner that allows for the removal, addition, or relocation of distributor plates as needed. As will become evident, the effectiveness of CVI/CVD assembly 10 and disclosed method can be limited primarily by the consumption of reactant gas by substrates 80 located closest to the gas inlet 14, 16 in use, and thereby availability of reactant gas for substrates 80 separated from the gas inlet 14, 16 in use by other substrates 80. Isobaric CVI is a relatively slow process, but can be used to densify a large number of preforms 80 at a time. The disclosed CVI/CVD assembly 10 and method can be used to uniformly densify a large number of fibrous preforms 80 at a time while reducing or eliminating the need to rearrange fibrous preforms 80 within reactor 12. While particularly suited to the process of densifying multiple fibrous preforms 80 simultaneously, it will be understood by one of ordinary skill in the art that the disclosed CVI/CVD assembly 10 and method can also be used to densify a small number of fibrous preforms 80 or a single fibrous preform 80.

Reactant gas can enter CVI/CVD reactor 12 through one of gas inlets 14 and 16. The reactant gas can be a gaseous ceramic precursor, for example, methyl trichlorosilane (MTS) and hydrogen ($H_2$), which diffuses into porous preforms 80 and reacts to form SiC. The SiC is deposited inside the pores of preforms 80 thereby densifying preforms 80. Reactant gas can flow from gas inlet 14 toward gas outlet 18 or from gas inlet 16 toward gas outlet 20, depending on the mode of operation. Reactant gas can surround preforms 80 and diffuse into preform pores. Factors effecting deposition of precursor gas in fibrous preforms 80 can include concentration, flow direction, flow rate, and residence time of reactant gas in reactor 12; temperature, pressure, geometry, and location of fibrous preforms 80; geometry of reactor 12; and the like. Heat source 46 can apply radiative or thermal energy to heat reactor chambers of reactor 12 to induce a chemical reaction. Heat source 46 can be any heat source and can be provided to reactor 12 in any configuration known in the art. In some embodiments, reactant gas may be heated by a preheater prior to entering reactor 12 as known in the art. In some embodiments, reactor 12 can be an isothermal reactor, such that reaction chamber 22 is kept at a uniform temperature. In alternative embodiments, reactor 12 can have a thermal gradient. A temperature gradient can enhance gas diffusivity and the rate of chemical reaction can increase with increasing temperature. The temperature can be greatest in the level 31, 29 located farthest from the open inlet 14, 16 to push the reaction where less reactant gas is available. In embodiments having a thermal gradient, the thermal gradient can be reversed in conjunction with the reversal of the flow of reactant gas to facilitate uniform densification of preforms 80.

During a first mode of operation, reactant gas can enter CVI/CVD reactor 12 through inlet 14 and flow toward gas outlet 18. To promote uniform densification or coating of preforms 80, the direction of gas flow can be reversed in a second mode of operation, such that reactant gas enters CVI/CVD reactor 12 through gas inlet 16 (located opposite of gas inlet 14 in reactor 12) and flows toward gas outlet 20 (located opposite of gas outlet 18 in reactor 12). In some embodiments, gas inlet 14 can be located at the top of reactor 12 with gas outlet located on the bottom of reactor 12, and gas inlet 16 can be located at the bottom of reactor 12 with gas outlet 20 located on the top of reactor 12. In other embodiments, gas inlets 12 and 14 and gas outlets 16 and 18 can be located on opposite walls of reactor 12 or can be otherwise disposed to direct gas flow through reactor 12 in opposite directions. As shown in FIGS. 1 and 2, gas inlets 14, 16 and gas outlets 18, 20 can be generally centrally located on top and bottom ends of reactor 12. In some embodiments, gas inlet 14 can be provided by a fluid conduit 54 that extends through a chamber of gas outlet 20 and into gas mixing chamber 28 of reactor 12. Likewise, gas inlet 16 can be provided by a fluid conduit 56 that extends through a chamber of gas outlet 18 and into gas mixing chamber 32 of reactor 12. Mixing chambers 28 and 32, defined between distributor plates 34 and 35 and 38 and 39, respectively, allow reactant gases to heat up and mix before reaching substrates 80. The reactant gas flow direction can be reversed multiple times during a CVI/CVD process to promote uniform matrix densification of preforms 80. The number of times gas flow is reversed can vary by application and depend on reaction rate and preform geometry. In a non-limiting embodiment, gas flow can be reversed 4 to 20 times during a CVI/CVD process lasting hundreds of hours. Modeling and simulation can be used to predict densification and determine how frequently gas flow should be reversed to promote uniform densification of preforms 80.

Reactant gas can be supplied to gas inlets 14, 16 by one or more gas sources 48. Multiple gas sources can feed gas inlets 14, 16 to avoid mixing reactant gases prior to entry into reactor 12. As illustrated in FIGS. 1 and 2, reactant gas can be supplied to gas inlets 14, 16 via gas line 52, equipped with valve 64 with mass flow controller 88 for regulating a flow rate of the reactant gas. Additional inlet valves 66, 68 on gas lines 54, 56 to inlets 14, 16, respectively, can be used to open and close gas inlets 14, 16. Although illustrated as single valved gas lines, it will be understood by one of ordinary skill in the art that gas lines 52, 54, and 56 can each comprise multiple conduits with multiple independent valves 64, 66, 68 for separate delivery of reactant gases as may be necessary to prevent reaction of the reactant gas prior to delivery to reactor 12. Gas lines 52, 54, 56 can comprise pipes, conduits, or other suitable devices for delivering fluid. In some embodiments, the multiple conduits can be bundled, without mixing the gases, in a single inlet pipe 14, 16 that extends into reactor 12. As illustrated in FIGS. 1 and 2, valve 66 controls the opening and closing of gas inlet 14 while valve 68 controls the opening and closing of gas inlet 16. In alternative embodiments, a single valve may be used to control gas flow from gas line 52 to gas inlets 14, 16, opening one of gas inlet 14, 16, while closing the other of gas inlets 14, 16. In some embodiments, valves 64, 66, and 68 can be controlled manually or automatically via controller 78 according to preprogrammed parameters and schedule.

In the first mode of operation (illustrated in FIG. 1), gas inlet 14 is open, allowing reactant gas to flow into reactor 12 toward gas outlet 18, which is also open (gas flow direction shown by arrows). Gas inlet 16 and gas outlet 20 are in a closed position during the first mode of operation. Reactant gas can enter reactor 12 in mixing chamber 28, defined between distributor plates 34 and 35, which are oriented parallel to the top wall of reactor 12. Reactant gas can fill mixing chamber 28 and enter reactor chamber 22 through a plurality of perforations or openings in distributor plate 35. Mixing chamber 28 can facilitate mixing and heating of reactant gas and uniform gas distribution across reaction chamber 22 to promote uniform densification of preforms 80. Vacuum pump 76 can be fluidly connected to gas outlet 18 and can draw reactant gas from reactor 12 through gas outlet 18. The flow of reactant gas toward gas outlet 18 limits flow of reactant gas through distributor plate 34 and completion bed 24 located adjacent to gas inlet 14. As illustrated in FIGS. 1 and 2, reaction chamber 22 is equipped with three levels or sub-chambers 29, 30, 31, with level 29 located nearest gas inlet 14, level 31 located nearest gas inlet 16, and level 30 positioned between levels 29 and 31. As reactant gas flows through reactor 12 from gas inlet 14, it is consumed by preforms 80 with more reactant gas being consumed by the preforms located in levels 29 and 30 positioned nearest to gas inlet 14, and with less reactant gas available for densifying the preforms in level 31 positioned farthest from gas inlet 14. Preforms in centrally-located level 30 can be densified to a lesser degree than preforms 80 in level 29, which is positioned nearest to gas inlet 14 and mixing chamber 28. To promote uniform densification, the direction of gas flow is reversed in a second mode of operation, which increases the amount of reactant gas available in level 31 of reaction chamber 22.

As illustrated in FIG. 2, during the second mode of operation, gas inlet 16 is open allowing reactant gas to flow into reactor 12 from the bottom of reactor 12 toward gas outlet 20 at the top of reactor 12 (gas flow direction shown by arrows), which is opposite the direction of gas flow in the first mode of operation. Gas inlet 14 and gas outlet 18 are in a closed position during the second mode of operation. In the second mode of operation, reactant gas can enter reactor 12 in mixing chamber 32 defined between distributor plates 38 and 39. Reactant gas can fill mixing chamber 32 and enter reaction chamber 22 through a plurality of perforations or openings in distributor plate 38. Mixing chamber 32 can facilitate mixing and heating of reactant gas and uniform gas distribution across reaction chamber 22 to promote uniform densification of preforms 80. Vacuum pump 76 can be fluidly connected to gas outlet 20 and can draw reactant gas from reactor 12 through gas outlet 20. The flow of reactant gas toward gas outlet 20 can limit the flow of reactant gas through distributor plate 39 and completion bed 26 located adjacent to gas inlet 16. As reactant gas flows through reactor 12 from inlet 16 toward outlet 20, it is consumed by preforms 80 with more reactant gas being consumed by the preforms located in levels 30 and 31 positioned nearest to gas inlet 16, and with less reactant gas available for densifying the preforms in level 29 positioned farthest from gas inlet 16. As such, preforms located in levels 30 and 31 are densified to a greater extent than preforms located in level 29 in the second mode of operation. In both the first mode and the second mode of operation, preforms in centrally-located level 30 can be densified to a lesser extent than the preforms in the levels closest to the gas inlet in use, but can be densified to a greater extent than the preforms located farthest from the gas inlet in use, such that densification of all preforms 80 within all levels 29, 30, 31 can be substantially uniform.

Vacuum pump 76 can be used to draw reactant gas flow from gas inlet 14, 16 toward the respective gas outlet 18, 20 in both the first and second modes of operation. A vacuum can be applied to reactor 12 in a manner that maintains isobaric conditions or constant pressure within reactor 12. Vacuum pump 76 can be fluidly connected to outlet 18 via gas line 60 and can be fluidly connected to gas outlet 20 via gas line 58. Gas lines 58, 60 can comprise pipes, conduits, or other suitable devices for delivering fluid. Valves 70 and 72 can be used to open and close gas outlets 18 and 20, respectively. In alternative embodiments, a single valve can be used to open and close both gas outlets 18 and 20. Pressure transducer 83 can measure a pressure in outlet gas lines 58, 60. Valve 74 located on gas line 60 can be used to adjust the vacuum to control the pressure inside reactor 12. In some embodiments, valves 70, 72, 74 can be manually or automatically controlled via controller 78 according to preprogrammed parameters and schedule.

Before exiting CVI/CVD reactor 12 through gas outlets 18, 20, remaining reactant gas can flow through completion beds 24, 26, respectively, which provide a surface area to complete reaction of unreacted precursors. As illustrated in FIGS. 1 and 2, completion beds 24, 26 can be positioned adjacent to gas outlets 18, 20 and can extend fully across reactor 12 to separate mixing chambers 28, 32 from gas outlets 18, 20, respectively, such that any gas exiting reactor 12 must pass through one of completion beds 24, 26. Completion beds 24, 26 can be defined between a reactor wall and distributor plate 34, 39. Distributor plates 34, 39 allow gases to diffuse or flow into completion beds 24, 26 and into gas outlets 18, 20. As illustrated in FIGS. 1 and 2, completion bed 24 is defined between distributor plate 34 and a top wall of reactor 12, which opens to gas outlet 20. Completion bed 26 is defined between distributor plate 39 and a bottom wall of reactor 12, which opens to gas outlet 18.

An inert gas can be delivered to reactor 12 prior to a CVI/CVD process to remove atmospheric air from reactor 12 and after a CVI/CVD process to remove reactant gas remaining in reactor 12. Inert gas can be delivered to reactor 12 from purge gas source 50 via gas line 62 and gas inlet 12 or 14. Valve 75 with mass flow controller 90 can be used to control the flow of purge gas into reactor 12. Vacuum pump 76 can be used to draw purge gas though reactor 12 and out through one of outlets 18, 20.

Figure 3:
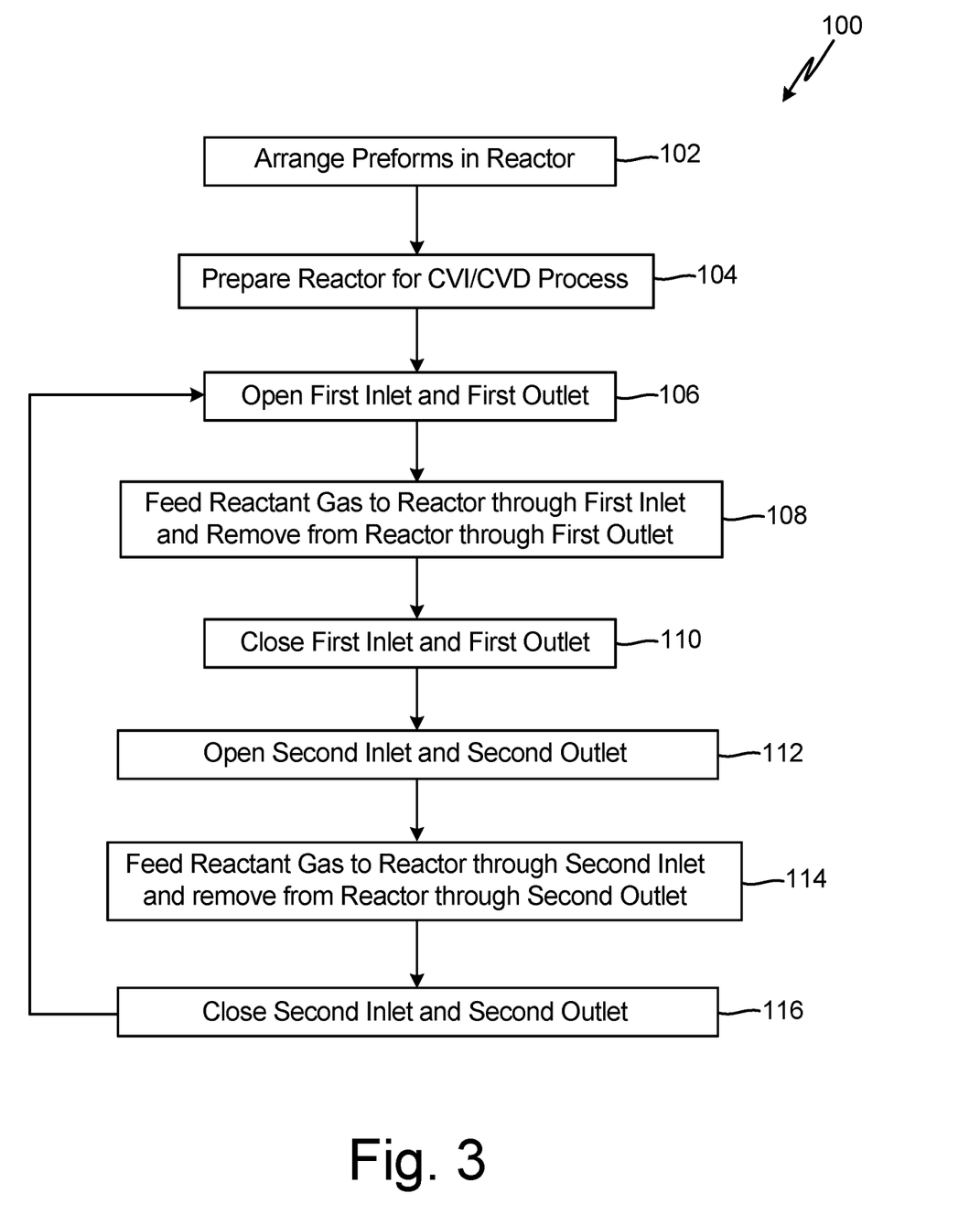
FIG. 3 illustrates a process of performing CVI/CVD.

FIG. 3 illustrates method 100 of performing CVI/CVD. Preforms or substrates 80 can be arranged in reactor 12 and reactor 12 can be sealed closed (step 102). As previously disclosed, preforms 80 can be arranged in stacks separated by spacers 82 and can be arranged in one or more reaction chamber levels 29, 20, 31. CVI/CVD assembly 10 can be further prepared for operation in step 104 (e.g., an inert gas can be delivered to reactor 12 to purge reactor 12 of ambient air, and reactor 12 can be heated and vacuumed to CVI process conditions). In the first mode of operation, inlet gas valve 66 and outlet gas valve 72 can be opened to allow flow of reactant gas through reactor 12 (step 106). Reactant gas can be fed to reactor 12 from reactant gas source 48 via gas line 54 and gas inlet 14, and vacuum pump 76 can be used to draw gas from reactor 12 through completion bed 26 to complete reaction of any unreacted gas, and to draw exhaust gas from completion bed 26 out of reactor 12 via gas outlet 18 (step 108). After a period of densification, gas inlet 14 and gas outlet 18 can be closed via valves 66 and 72, respectively (step 110) and gas inlet 16 and gas outlet 20 can be opened via valves 68 and 70, respectively (step 112). This reverses gas flow within reactor 12, causing reactant gas to flow from gas inlet 16 toward gas outlet 20 in a second mode of operation (step 114). In the second mode of operation, vacuum pump 76 can be used to draw gas from reactor 12 through completion bed 24 to complete reaction of any unreacted gas, and to draw exhaust gas from completion bed 24 out of reactor 12 through gas outlet 20. After a period of densification, gas inlet 16 and gas outlet 20 can be closed (step 116) and steps 106 through 108 can be repeated to again reverse the direction of flow of reactant gas through reactor 12. Steps 106 through 116 can be repeated multiple times throughout the CVI/CVD process to promote uniform densification of preforms 80. Following completion of the CVI/CVD process, inert gas can be fed to reactor 12 via gas inlet 14 or 16 to purge reactor 12 of unreacted precursor gas.

CVI/CVD assembly 10 and the disclosed method provide an efficient means for providing uniform matrix densification of fibrous preforms. By alternating reactant gas flow through reactor 12, CVI/CVD assembly 10 can improve uniformity in matrix densification while eliminating the need to shut down the CVI/CVD process to rearrange fibrous preforms within reactor 12. This can reduce operation time and production costs.

Summation

Any relative terms or terms of degree used herein, such as "substantially", "essentially", "generally", "approximately" and the like, should be interpreted in accordance with and subject to any applicable definitions or limits expressly stated herein. In all instances, any relative terms or terms of degree used herein should be interpreted to broadly encompass any relevant disclosed embodiments as well as such ranges or variations as would be understood by a person of ordinary skill in the art in view of the entirety of the present disclosure, such as to encompass ordinary manufacturing tolerance variations, incidental alignment variations, transient alignment or shape variations induced by thermal, rotational or vibrational operational conditions, and the like. Moreover, any relative terms or terms of degree used herein should be interpreted to encompass a range that expressly includes the designated quality, characteristic, parameter or value, without variation, as if no qualifying relative term or term of degree were utilized in the given disclosure or recitation.

Discussion of Possible Embodiments

The following are non-exclusive descriptions of possible embodiments of the present invention.

A chemical vapor infiltration and deposition (CVI/CVD) reactor assembly according to an exemplary embodiment of this disclosure, among other possible things includes a CVI/CVD reactor and a reactant gas feed source. The CVI/CVD reactor includes a first inlet at a first end of the CVI/CVD reactor, a second inlet at a second end of the CVI/CVD reactor opposite the first end, a first outlet at the second end, a second outlet at the first end, and a chamber in fluid communication with the first and second inlets and first and second outlets and configured to hold a substrate. The reactant gas feed source is interchangeably and fluidly connected to the first and second inlets by first and second valved gas lines, respectively.

The CVI/CVD reactor assembly of the preceding paragraph can optionally include, additionally and/or alternatively, any one or more of the following features, configurations, and/or additional components:

A further embodiment of the foregoing CVI/CVD reactor assembly, wherein the chamber can further include a first completion bed at the first end configured to provide a surface area for completing reaction of unreacted reactant gas, and a second completion bed at the second end configured to provide a surface are for completing reaction of unreacted reactant gas.

A further embodiment of any of the foregoing CVI/CVD reactor assemblies, wherein the chamber can further include a plurality of gas distributor plates, wherein the gas distributor plates divide the chamber between the first end and the second end into a plurality of sub-chambers.

A further embodiment of any of the foregoing CVI/CVD reactor assemblies, wherein the plurality of sub-chambers can include a first mixing chamber formed adjacent to the first completion bed, a second mixing chamber formed adjacent to the second completion bed, and a central reactor chamber formed between the first and second mixing chambers. The first inlet can open to the first mixing chamber and the second inlet can open to the second mixing chamber.

A further embodiment of any of the foregoing CVI/CVD reactor assemblies, wherein the first and second inlets can include first and second inlet conduits, respectively, wherein the first inlet conduit extends through the first completion bed and the second inlet conduit extends through the second completion bed such that the first and second inlet conduits are closed to the first and second completion beds, respectively.

A further embodiment of any of the foregoing CVI/CVD reactor assemblies, wherein the central reactor chamber can be configured to hold the substrate.

A further embodiment of any of the foregoing CVI/CVD reactor assemblies, wherein the substrate can be a fibrous preform and wherein the central reactor chamber can be configured to hold a plurality of fibrous preforms arranged in a stacked formation.

A further embodiment of any of the foregoing CVI/CVD reactor assemblies, wherein the central reactor chamber can include a plurality of reactor sub-chambers formed between the first and second mixing chambers and separated by gas distributor plates.

A further embodiment of any of the foregoing CVI/CVD reactor assemblies, wherein the assembly can be configured to operate in a first mode of operation and a second mode of operation in an alternating manner. The first mode comprises supplying gas to the chamber through the first inlet and exhausting gas from the chamber through the first outlet. The second mode of operation comprises supplying gas to the chamber through the second inlet and exhausting gas from the chamber through the second outlet A further embodiment of any of the foregoing CVI/CVD reactor assemblies can further include a first inlet valve configured to open and close the first inlet to reactant gas flow, a second inlet valve configured to open and close the second inlet to reactant gas flow, a first outlet valve configured to open and close the first outlet to exhaust gas flow, and a second outlet valve configured to open and close the second outlet to exhaust gas flow.

A further embodiment of any of the foregoing CVI/CVD reactor assemblies can further include a vacuum pump fluidly connected to the first and second outlets.

A further embodiment of any of the foregoing CVI/CVD reactor assemblies can further include a controller commutatively connected to a valve configured to switch operation between the first mode of operation and the second mode of operation.

A further embodiment of any of the foregoing CVI/CVD reactor assemblies, wherein the first outlet can be adjacent to the second completion bed and the second outlet can be located adjacent to the first completion bed A chemical vapor infiltration and deposition (CVI/CVD) process according to an exemplary embodiment of this disclosure, among other possible things includes supplying a reactant gas to a CVI/CVD reactor chamber through a first inlet located at a first end of the reactor chamber, removing a first exhaust gas from the reactor chamber through a first outlet located at a second end of the reactor chamber opposite the first end, supplying the reactant gas to the reactor chamber through a second inlet located at the second end of the reactor chamber, and removing a second exhaust gas from the reactor chamber through a second outlet at the first end of the reactor chamber. Supplying the reactant gas through the first inlet and the second inlet is conducted in an alternating fashion.

The CVI/CVD process of the preceding paragraph can optionally include, additionally and/or alternatively, any one or more of the following features, configurations, additional components, and/or steps:

A further embodiment of the foregoing CVI/CVD process can include flowing the reactant gas through a first completion bed adjacent to the first outlet to produce the first exhaust gas and flowing the reactant gas through a second completion bed adjacent to the second outlet to produce the second exhaust gas.

A further embodiment of any of the CVI/CVD processes, wherein supplying the reactant gas through the first inlet can predominantly densify a first plurality of porous structures in the reactor chamber and wherein supplying the reactant gas through the second inlet can predominantly densify a second plurality of porous structures in the reactor, and wherein the first and second pluralities of porous structures can be arranged in a stacked formation between the first inlet and the second inlet with the first plurality of porous structures located nearer the first inlet than the second inlet and with the second plurality of porous structures located nearer the second inlet than the first inlet.

A further embodiment of any of the CVI/CVD processes, wherein the positions of the first plurality of porous structures and the second plurality of porous structures within the reactor chamber can remain substantially constant through the CVI/CVD process.

A further embodiment of any of the CVI/CVD processes, wherein supplying the reactant gas to the CVI/CVD reactor chamber can include opening a first inlet valve fluidly connecting the first inlet to a reactant gas source and opening a second inlet valve fluidly connecting the second inlet to the reactant gas source. The first and second inlet valves can be opened alternatively, such that only one of the first or second inlet valves is open at any given time of the CVI/CVD process.

A further embodiment of any of the CVI/CVD processes, wherein removing the first and second exhaust gases from the reactor chamber can include opening a first outlet valve fluidly connecting the first outlet to a vacuum pump and opening a second outlet valve fluidly connecting the second outlet to the vacuum pump. The first and second outlet valves can be opened alternatively. The first outlet valve can be open when the first inlet valve is open and the second outlet valve can be open when the second inlet valve is open, such that only one of the first or second outlet valves is open at any given time of the CVI/CVD process.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A chemical vapor infiltration and deposition (CVI/CVD) reactor assembly comprising:
   a CVI/CVD reactor comprising:
      a first inlet at a first end of the CVI/CVD reactor;
      a second inlet at a second end of the CVI/CVD reactor opposite the first end;
      a first outlet at the second end;
      a second outlet at the first end; and
      a chamber in fluid communication with the first and second inlets and first and second outlets and configured to hold a substrate, wherein the chamber comprises:
         a first completion bed at the first end configured to provide surface area for completing reaction of unreacted reactant gas; and a second completion bed at the second end configured to provide surface area for completing reaction of unreacted reactant gas; and
a reactant gas feed source interchangeably and fluidly connected to the first and second inlets by first and second valved gas lines, respectively.

2. The CVI/CVD reactor assembly of claim 1, wherein the chamber further comprises a plurality of gas distributor plates, wherein the gas distributor plates divide the chamber between the first end and the second end into a plurality of sub-chambers.

3. The CVI/CVD reactor assembly of claim 2, wherein the plurality of sub-chambers comprises:
a first mixing chamber formed adjacent to the first completion bed;
a second mixing chamber formed adjacent to the second completion bed; and
a central reactor chamber formed between the first and second mixing chambers;
wherein the first inlet opens to the first mixing chamber and wherein the second inlet opens to the second mixing chamber.

4. The CVI/CVD reactor assembly of claim 3, wherein the first and second inlets comprise first and second inlet conduits, respectively, wherein the first inlet conduit extends through the first completion bed and the second inlet conduit extends through the second completion bed such that the first and second inlet conduits are closed to the first and second completion beds, respectively.

5. The CVI/CVD reactor assembly of claim 4, wherein the central reactor chamber is configured to hold the substrate.

6. The CVI/CVD reactor assembly of claim 5, wherein the substrate is a fibrous preform and wherein the central reactor chamber is configured to hold a plurality of fibrous preforms arranged in a stacked formation.

7. The CVI/CVD reactor assembly of claim 5, wherein the central reactor chamber comprises a plurality of reactor sub-chambers formed between the first and second mixing chambers and separated by gas distributor plates.

8. The CVI/CVD reactor assembly of claim 5, wherein the assembly is configured to operate in a first mode of operation and a second mode of operation in an alternating manner, wherein the first mode comprises supplying gas to the chamber through the first inlet and exhausting gas from the chamber through the first outlet, and wherein the second mode of operation comprises supplying gas to the chamber through the second inlet and exhausting gas from the chamber through the second outlet.

9. The CVI/CVD reactor assembly of claim 8 and further comprising:
a first inlet valve configured to open and close the first inlet to reactant gas flow;
a second inlet valve configured to open and close the second inlet to reactant gas flow;
a first outlet valve configured to open and close the first outlet to exhaust gas flow; and
a second outlet valve configured to open and close the second outlet to exhaust gas flow.

10. The CVI/CVD reactor assembly of claim 8 and further comprising a vacuum pump fluidly connected to the first and second outlets.

11. The CVI/CVD reactor assembly of claim 10 and further comprising a controller commutatively connected to a valve configured to switch operation between the first mode of operation and the second mode of operation.

12. The CVI/CVD reactor assembly of claim 10, wherein the first outlet is adjacent to the second completion bed and the second outlet is located adjacent to the first completion bed.

13. The CVI/CVD reactor of claim 12, wherein the reactor chamber is isobaric.

14. A chemical vapor infiltration and deposition (CVI/CVD) process comprising:
supplying a reactant gas to a CVI/CVD reactor chamber through a first inlet located at a first end of the reactor chamber;
flowing the reactant gas through a first completion bed to produce a first exhaust gas, wherein the first completion bed is located at a second end of the reactor chamber opposite the first end and provides a surface area for completing reaction of unreacted reactant gas, wherein flowing the reactant gas through the first completion bed completes reaction of the reactant gas to produce the first exhaust gas;
removing the first exhaust gas from the reactor chamber through a first outlet located at the second end of the reactor chamber;
supplying the reactant gas to the reactor chamber through a second inlet located at the second end of the reactor chamber;
flowing the reactant gas through a second completion bed to produce a second exhaust gas, wherein the second completion bed is located at the first end of the reactor chamber and provides a surface area for completing reaction of unreacted reactant gas, wherein flowing the reactant gas through the second completion bed completes reaction of the reactant gas to produce the second exhaust gas; and
removing the second exhaust gas from the reactor chamber through a second outlet at the first end of the reactor chamber;
wherein supplying the reactant gas through the first inlet and the second inlet densifies a plurality of porous substrates held in the reactor chamber; and
wherein supplying the reactant gas through the first inlet and the second inlet is conducted in an alternating fashion by a reactant gas feed source interchangeably and fluidly connected to the first and second inlets by first and second valved gas lines, respectively.

15. The CVI/CVD process of claim 14, wherein supplying the reactant gas through the first inlet predominantly densifies a first plurality of porous substrates in the reactor chamber and wherein supplying the reactant gas through the second inlet predominantly densifies a second plurality of porous substrates in the reactor chamber, wherein the first and second pluralities of porous substrates are arranged in a stacked formation between the first inlet and the second inlet with the first plurality of porous substrates located nearer the first inlet than the second inlet and with the second plurality of porous substrates located nearer the second inlet than the first inlet.

16. The CVI/CVD process of claim 15, wherein the positions of the first plurality of porous substrates and the second plurality of porous substrates within the reactor chamber remain substantially constant through the CVI/CVD process.

17. The CVI/CVD process of claim 14, wherein supplying the reactant gas to the CVI/CVD reactor chamber comprises:
opening a first inlet valve fluidly connecting the first inlet to the reactant gas source; and
opening a second inlet valve fluidly connecting the second inlet to the reactant gas source;

wherein the first and second inlet valves are opened alternatively, such that only one of the first or second inlet valves is open at any given time of the CVI/CVD process.

18. The CVI/CVD process of claim 17, wherein removing the first and second exhaust gases from the reactor chamber comprises:
- opening a first outlet valve fluidly connecting the first outlet to a vacuum pump; and
- opening a second outlet valve fluidly connecting the second outlet to the vacuum pump;
- wherein the first and second outlet valves are opened alternatively and wherein the first outlet valve is open when the first inlet valve is open and wherein the second outlet valve is open when the second inlet valve is open, such that only one of the first or second outlet valves is open at any given time of the CVI/CVD process.

\* \* \* \* \*